United States Patent [19]

Hirayama

[11] Patent Number: 4,802,842
[45] Date of Patent: Feb. 7, 1989

[54] APPARATUS FOR MANUFACTURING SEMICONDUCTOR DEVICE

[75] Inventor: Makoto Hirayama, Itami, Japan

[73] Assignee: Mitsubishi Denki Kabushiki Kaisha, Tokyo, Japan

[21] Appl. No.: 83,020

[22] Filed: Aug. 4, 1987

Related U.S. Application Data

[63] Continuation of Ser. No. 884,294, Jul. 10, 1986, abandoned.

[30] Foreign Application Priority Data

Jul. 15, 1985 [JP] Japan ................................ 60-156582

[51] Int. Cl.[4] .............................................. F23D 5/00
[52] U.S. Cl. ........................................... 432/5; 432/6; 432/253; 432/258
[58] Field of Search ....................... 432/5, 6, 253, 259, 432/258

[56] References Cited

U.S. PATENT DOCUMENTS

| | | | |
|---|---|---|---|
| 1,841,641 | 1/1932 | Schreiber | 432/259 |
| 1,920,589 | 8/1933 | Payne | 432/258 |
| 1,941,941 | 1/1934 | Irwin | 432/259 |
| 2,567,609 | 9/1951 | Lovatt | 432/259 |
| 2,923,997 | 2/1960 | Emmerling | 432/258 |
| 4,153,164 | 5/1979 | Hofmeister et al. | |
| 4,167,391 | 9/1979 | Lovatt | 432/258 |

FOREIGN PATENT DOCUMENTS

| | | |
|---|---|---|
| 2448820 | 4/1975 | Fed. Rep. of Germany . |
| 2453509 | 5/1975 | Fed. Rep. of Germany . |
| 2722545 | 11/1978 | Fed. Rep. of Germany . |
| 720571 | 2/1932 | France ............................ 432/258 |
| 2415785 | 1/1978 | France . |
| 524048 | 4/1955 | Italy ............................... 432/258 |
| 601880 | 5/1948 | United Kingdom ........... 432/258 |

OTHER PUBLICATIONS

"High Pressure Oxidation of Silicon by the Pyrogenic or Pumped Water Technique", L. E. Katz et al, Solid State Technology, Dec. 1981, pp. 87–93.

Primary Examiner—Henry C. Yuen
Attorney, Agent, or Firm—Lowe, Price, LeBlanc, Becker & Shur

[57] ABSTRACT

In a heating furnace for forming films on semiconductor substrates (1), holding means (2, 4) for holding semiconductor substrates (1) are provided with projections (3, 5) for holding at least part of bottom faces of the semiconductor substrates (1) horizontally with predetermined spacing between the projections.

2 Claims, 2 Drawing Sheets

APPARATUS FOR MANUFACTURING SEMICONDUCTOR DEVICE

This application is a continuation of application Ser. No. 884,924, filed July 10, 1986, now abandoned.

BACKGROUND OF THE INVENTION

1. Field of the Invention

The present invention relates to a semiconductor device manufacturing apparatus for manufacturing semiconductor devices on semiconductor substrates and more particularly, it relates to an improvement of a semiconductor device manufacturing apparatus including a vertical type of heating furnace for forming films on semiconductor substrates.

2. Description of the Prior Art

In the past, various semiconductor device manufacturing apparatus have been known for forming films, such as oxide films, nitride films, polysilicon films, on silicon substrates or the like for forming a semiconductor device. As such semiconductor device manufacturing apparatus, various oxidizing equipment and CVD (Chemical Vapor Deposition) equipment have been used.

Such semiconductor device manufacturing apparatus comprise a horizontal heating furnace, and others comprise a vertical heating furnace. The structure of a horizontal heating furnace is disclosed in, for example, an article by L.E. Katz et al. entitled "High Pressure Oxidation of Silicon by the Pyrogenic or Pumped Water Technique", Solid State Technology, Dec. 1981, pp 87-93. In forming films, a plurality of semiconductor substrates are disposed approximately vertically in a horizontal heating furnace, whereas semiconductor substrates are juxtaposed horizontally with predetermined spacings in a vertical heating furnace.

FIG. 1 is a diagram showing a holder used for holding silicon wafers in a conventional vertical heating furnace. As a material of this holder, for example, quartz, silicon carbide, or polysilicon is used. In FIG. 1, each of three supports 8 of a holder 7 is formed with grooves 9 for inserting silicon wafers 1 in a longitudinal direction of each of the supports 8, with a predetermined spacing between grooves. The silicon wafers 1 are inserted into the grooves 9 one by one and then are placed within a vertical heating furnace of a semiconductor device manufacturing apparatus to be heated. Then, raw material gas for forming films on the silicon wafers 1 is introduced into this vertical heating furnace.

In a conventional semiconductor device manufacturing apparatus, a holder of silicon wafers is constructed as described above. If silicon wafers are inserted into grooves of the holder, a part of the silicon wafers inserted into the grooves becomes covered by a part of the support. This causes a problem in which the films formed do not grow uniformly, because raw material gas for forming films do not sufficiently reach this portion, and a difference in film thickness occurs on the surface of silicon wafers.

There also has been a problem in which this portion is contaminated by bringing a part of silicon wafers into contact with the edge of grooves by mistake in inserting silicon wafers into grooves.

SUMMARY OF THE INVENTION

A principal object of the present invention is to provide a semiconductor device manufacturing apparatus which drastically improves uniformity of thickness of films formed on the surface of semiconductor substrates, as well as can prevent the contamination of the surface caused in inserting the semiconductor substrates.

Briefly stated, the present invention is directed to a heating furnace for forming films on semiconductor substrates, in which holding means for holding semiconductor substrates are provided with projections for holding at least part of the bottom faces of semiconductor substrates horizontally, with predetermined spacing between the projections.

In accordance with the present invention, raw material gas flows uniformly over semiconductor substrates, resulting in films having uniform thickness.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
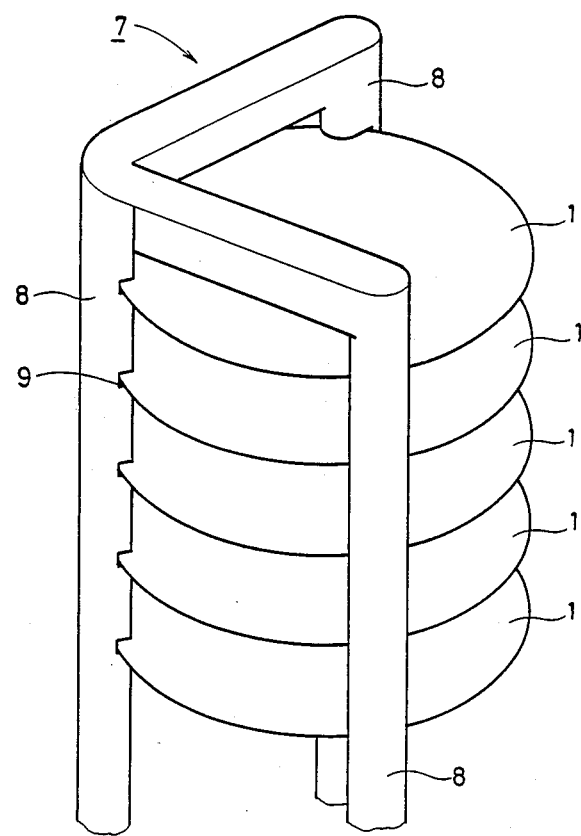
FIG. 1 is a diagram showing a holder for conventional semiconductor substrates.
Figure 2:
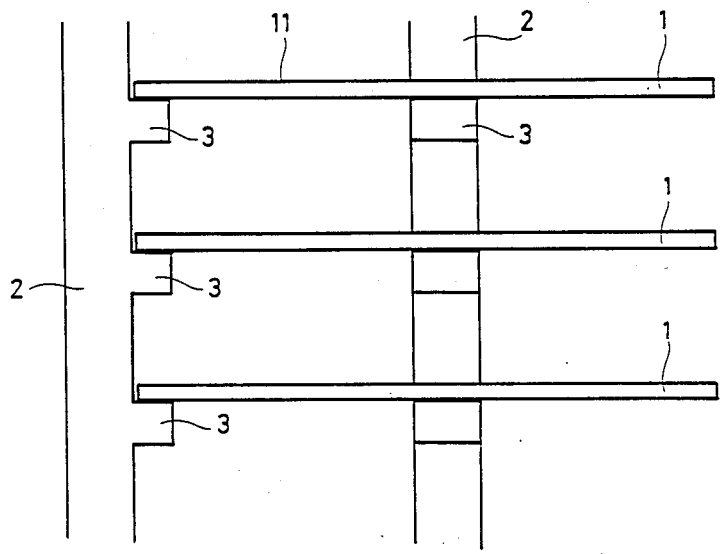
FIG. 2 is a diagram showing a holder for semiconductor substrates of an embodiment of the present invention.

FIG. 2 is a diagram showing a holder for semiconductor substrates used in a semiconductor device manufacturing apparatus of an embodiment of the present invention. The holder comprises for example three supports, although they are not illustrated in FIG. 2. In FIG. 2, the respective supports 2 of this holder are provided with projections 3 horizontally relative to a longitudinal direction of each of the supports, with predetermined spacing between the projections 3, and semiconductor substrates, such as silicon wafers 1 are disposed approximately horizontally on these projections 3. Projections 3 may be provided so that silicon wafers 1 can be supported completely in the horizontal direction. However, in such a case, the silicon wafers 1 can cause rotational motion during formation of films and hence, to prevent this, projections 3 are provided so that silicon wafers 1 can be supported while slightly inclined. The spacings between projections 3 as disposed horizontally is such that raw material gas of films to be formed on the surface 11 of silicon wafers 1 flows smoothly.

Since in the present invention the semiconductor substrates are supported by the projections, as described above, instead of conventional grooves, raw material gas flows uniformly on the semiconductor substrates, permitting formation of films having uniform thickness.

Figure 3:
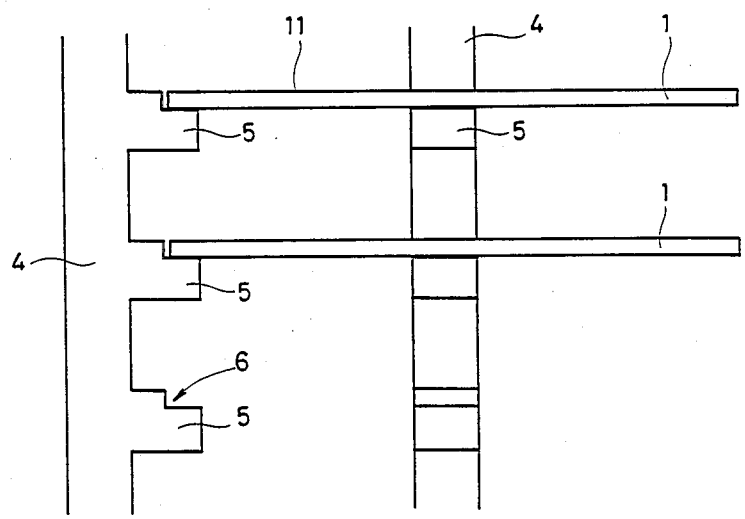
FIG. 3 is a diagram showing a holder for semiconductor substrates of another embodiment of the present invention.

FIG. 3 is a diagram showing another embodiment of the present invention. In FIG. 3, supports 4 of a holder are provided with projections 5 longer than projections 3 shown in FIG. 2. Projections 5 are provided with stepped portions 6, and silicon wafers 1 are engaged with these stepped portions 6. The location of projections 5 between supports 4 and the spacings between projections 5 are similar to the embodiment shown in FIG. 2. That is, projections 5 are arranged with such spacings that silicon wafers 1 can be held horizontally or with slightly inclined, and raw material gas can flow uniformly on the silicon wafers.

Since in the holder shown in FIG. 3 in comparison with the holder shown in FIG. 2, silicon wafers 1 are provided away from supports, the flow of raw material gas becomes more uniform.

As a material of the holders shown in FIG. 2 and FIG. 3, quartz, silicon carbide, polysilicon or the like is usually used, but it is not intended to be limited.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of forming a uniform film on a semiconductor substrate in a heating furnace, comprising the steps of positioning a plurality of semiconductor substrates within a supporting structure having a plurality of supports for holding said plurality of semiconductor substrates in generally parallel, spaced relation to each other, said supports being circumferentially spaced from each other and each support having projections spaced from each other along the support, said projections each having an upward exposed surface contacting to support at least part of a bottom face of each semiconductor substrate and wherein adjacent projections on each support are sufficiently vertically spaced from each other so that the spacing between an upper peripheral surface of one substrate and the bottom surface of an adjacent above projection overlying said upper peripheral surface is considerably greater than the thickness of said substrate; placing the supporting structure containing the stacked substrates within a vertical heating furnace; and introducing a raw material gas within the heating furnace for forming films on the upper surface of the substrates, the said spacing enabling a free flow of said gas along substantially the entire surface of each substrate including substantially the entire peripheral surface thereof to induce a uniform film along the entire surface of each ubstrate, wherein each projection has an upward exposed surface formed with a step portion, and wherein the wherein the upward exposed surface of each projection includes a notched portion defining a step portion having a depth approximately equal to the thickness of the semiconductor substrate so that the upper surface of the substrate exposed to the raw material gas is substantially coplanar with the remainder of the upward exposed surface of the projections located radially outward from the substrate upper surface.

2. A method of forming a uniform film on a semiconductor substrate in a heating furnace, comprising the steps of positioning a plurality of semiconductor substrates within a supporting structure having a plurality of supports for holding said plurality of semiconductor substrates in generally parallel, spaced relation to each other, said supports being circumferentially spaced from each other and each support having projections spaced from each other along the support, said projections each having an upward exposed surface contacting to support at least part of a bottom face of each semiconductor substrate and wherein adjacent projections on each support are sufficiently vertically spaced from each other so that the spacing between an upper peripheral surface of one substrate and the bottom surface of an adjacent above projections overlying said upper peripherial surface is considerably greater than the thickness of said substrate; placing the supporting structure containing the stacked substrates within a vertical heating furnace; and introducing a raw material gas within the heating furnace for forming films on the upper surface of the substrates, the said spacing enabling a free flow of said gas along substantially the entire surface of each substrate including substantially the entire peripheral surface thereof to induce a uniform film along the entire surface of each substrate, wherein said projections and supports being further structured such that the upward and lower surfaces of substantially each projection are generally parallel to each other and substantially horizontal in operative position and wherein the inner substantially vertical surface of each support extending between vertically adjacent projections on said support extends smoothly and continuously and generally perpendicular to said upward and lower surfaces to define said interior volumtric region being a substantially cylindrical regions in conjunction with the said spacing between adjacent stacked substrates enabling said free flow of gas to occur.

* * * * *